(12) United States Patent
Fujii et al.

(10) Patent No.: US 6,191,633 B1
(45) Date of Patent: Feb. 20, 2001

(54) SEMICONDUCTOR INTEGRATED CIRCUIT WITH PROTECTION CIRCUIT AGAINST ELECTROSTATIC DISCHARGE

(75) Inventors: Takeo Fujii; Kaoru Narita; Yoko Horiguchi, all of Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/149,115

(22) Filed: Sep. 9, 1998

(30) Foreign Application Priority Data

Sep. 12, 1997 (JP) .................................................. 9-248271

(51) Int. Cl.[7] .................................................. H03K 5/08
(52) U.S. Cl. .................................................. 327/313; 327/333
(58) Field of Search .................................. 327/309, 310, 327/313, 314, 324, 325, 327, 328, 333

(56) References Cited

U.S. PATENT DOCUMENTS

| | | | |
|---|---|---|---|
| 4,423,431 | * 12/1983 | Sasaki | 357/41 |
| 4,691,217 | * 9/1987 | Ueno et al. | 357/23.13 |
| 4,922,371 | * 5/1990 | Gray et al. | 361/91 |
| 5,545,909 | * 8/1996 | Williams et al. | 257/355 |
| 5,663,678 | * 9/1997 | Chang | 327/566 |
| 5,760,630 | * 6/1998 | Okamoto | 327/310 |
| 5,770,964 | * 6/1998 | Suma | 327/328 |
| 5,942,931 | * 8/1999 | Yanai | 327/313 |
| 5,973,901 | * 10/1999 | Narita et al. | 361/111 |

FOREIGN PATENT DOCUMENTS

| | | |
|---|---|---|
| 5-667962 | 6/1981 | (JP) . |
| 5-9231847 | 12/1984 | (JP) . |
| 3-234058 | 10/1991 | (JP) . |
| 7-169962 | 7/1995 | (JP) . |

* cited by examiner

*Primary Examiner*—Jeffrey Zweizig
(74) *Attorney, Agent, or Firm*—Young & Thompson

(57) ABSTRACT

A Semiconductor integrated circuit with a protection circuit against electrostatic discharge. A clamping element is connected with MIS transistor to prevent the breakdown under the charged device model. A parasitic bipolar transistor, a MOS transistor or MIS transistor whose gate is composed of an insulating film thicker than that of the transfer gate, can be used as the clamping element.

16 Claims, 1 Drawing Sheet

SEMICONDUCTOR INTEGRATED CIRCUIT WITH PROTECTION CIRCUIT AGAINST ELECTROSTATIC DISCHARGE

BACKGROUND OF THE INVENTION

1. Technical Field of the Invention

The present invention relates to a semiconductor integrated circuit which may possibly be destroyed by electrostatic discharge and particularly, to a semiconductor integrated circuit provided with metal insulator semiconductor (MIS) transistor as a transfer gate.

2. Description of the Prior Art

Generally, the breakdown of semiconductor integrated circuits by electrostatic discharge is of great interest, as the scale of integrated circuits becomes greater. Consequently, various models such as human model, charged device model and charged package model are used to analyze the electrostatic breakdown of integrated circuits. It is desirable that the integrated circuits do not suffer the electrostatic breakdown under each model. Particularly, the integrated circuit is usually required to be resistant electrostatically against around 600 Volt under the charged device model and the charged package model.

For preventing the electrostatic discharge, there is disclosed in Japanese Patent 07169962A (1985) a semiconductor circuit with protection MOSFETs connected between a external terminal and a gate of an output MOSFET, wherein the channel length of the protection MOSFETs are greater than or equal to that of the output MOSFET.

A suitable voltage source is connected with the gates of the protection MOSFETs to turn off the protection MOSFETs during the normal state. If an abnormally high voltage is applied to the protection MOSFETs, the protection MOSFETs are turned on to prevent the breakdown of the oxide film of the output MOSFET.

There is also disclosed in Japanese Patent 63-181469A (1988) another protection circuit, wherein a protection MOS FET is placed in between the gate and the source of an input MOS transistor. This protection circuit prevents the electrostatic breakdown of the insulating film of the input MOS transistor, when a surge voltage is inputted into the input MOS transistor.

The recent high speed DRAMs are often provided with a transfer gate made of MIS transistor between an input pad and an internal circuit, wherein the gate of the MIS transistor is connected with a voltage source with its drain being connected with the internal circuit and with its source being connected through a register with an input pad or external terminal, and a protection element such as diode is inserted between the input pad and the ground, whereby the breakdown by the electrostatic dischargeis prevented.

The above-mentioned transfer gate is used to limit the amplitude of external signals and to adapt the timing of the external signals with that of the internal circuit.

However, in Reference 1, the number of the protection MOSFETs increases, as the number of the output transistors which should be protected increases. Therefore, the conventional circuit as disclosed in the above-mentioned reference has a disadvantage that the construction of the circuit becomes complex and the integration degree can not be improved. Further, the circuit construction becomes more complex, so as to prevent the breakdown of the protection MOSFET itself. In reference 2, the protection MOS FET itself breaks down under severe conditions.

Further, in case of semiconductor integrated circuits such as DRAM which is provided with a transfer gate for each input pad, the inventors of the present invention found that the gate insulating film of the MIS transistor used as the transfer gate is easily broken down under the electrostatic discharge, when the gradually charged electric charges are abruptly discharged during an experiment on the basis of the charged device model. The fact is that the breakdown could not be prevented even by inserting any protection element between the input pad and the ground.

SUMMARY OF THE INVENTION

Therefore, an object of the present invention is to provide a protection element with a high resisting voltage required in the charged device model experiment.

Another object of the present invention is to provide a clamping element which can suppress the decline of the integration degree at a minimum.

A further object of the present invention is to provide a semiconductor integrated circuit having transfer gates with a protection element for preventing the breakdown of insulating film.

In accordance with the present invention, there is provided a parasitic bipolar transistor as a clamping element to prevent the breakdown of a semiconductor integrated circuit.

Further, according to the present invention, there is provided a semiconductor integrated circuit which comprises an input pad and an internal circuit, wherein a transfer gate is connected between the input pad and the internal circuit. The transfer gate is connected with a clamping element which may be a bipolar transistor, or a MOS transistor whose gate is supplied with thick insulating film.

According to the present invention as explained above, the MIS transistor as a transfer gate connected with a clamping element can be protected against the breakdown.

PREFERRED EMBODIMENT OF THE INVENTION

Figure 1:
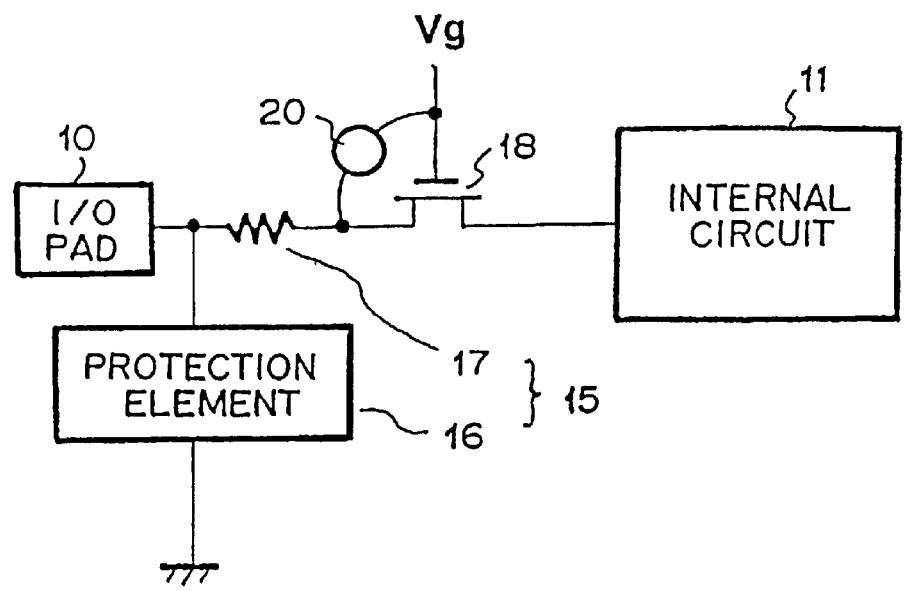
FIG. 1 is a circuit diagram of the semiconductor integrated circuit of the present invention.

Referring to the drawings, a preferred embodiment of the present invention is explained.

A semiconductor integrated circuit of the present invention as shown in FIG. 1 comprises input pad 10 and internal circuit 11. Further, transfer gate 18 comprising a MIS transistor is connected between input pad 10 and internal circuit 11. Here, input pad 10 may be replaced by an output pad.

Concretely, protection circuit 15 comprises protection element 16 such as diode, and resistor 17. The gate of MIS transistor 18 is supplied with voltage Vg by an internal voltage source or an external voltage source.

Further, clamping element 20 is connected between the gate and either of the source or the drain of MIS transistor 18. Clamping element 20 is adjacent to MIS transistor 18.

Here, the behavior of protection circuit is explained, assuming that clamping element is not inserted. In this case, the electrostatic voltage applied to input pad 10 in the human body model is clamped by protection element 16. Thus, an excessive voltage is prevented from being applied to internal circuit 11.

Further, the input signal amplitude from input pad 10 is limited during normal state, because MIS transistor 18 as a transfer gate is connected with protection element 16 and internal circuit 11.

In the charged device model, a device is slowly charged up, and then a certain pin such as input pad 10 is abruptly discharged. During the above-mentioned slow charge-up, all the nodes as shown in FIG. 1 are charged. Then, afterward, pad 10 is suddenly discharged, while the discharge of the power line is delayed. Therefore, excessively high voltage is applied to MOS transistor 18. This results in the breakdown of MOS transistor 18.

The inventors have found that the cause of the breakdown is a discharge on the line connected with MIS transistor 18 and found a means for preventing the breakdown. The breakdown of the gate insulating film is prevented by using clamping element 20 connected with the source and the gate of MIS transistor 18, as shown in FIG. 1.

Diodes, MISFETs, and parasitic bipolar transistors are all well-known clamping elements. For example, a MIS transistor as a clamping element may be connected between the gate of MIS transistor 18 and either of the source or drain of MIS transistor 18. In other words, the source or drain of MIS transistor 20 as a clamping element is connected with the input of MIS transistor 18. Alternatively, emitter and collector of a bipolar transistor may be used as the terminals of a clamping element to configure the bipolar as a two terminal parasitic protection device.

Figure 2:
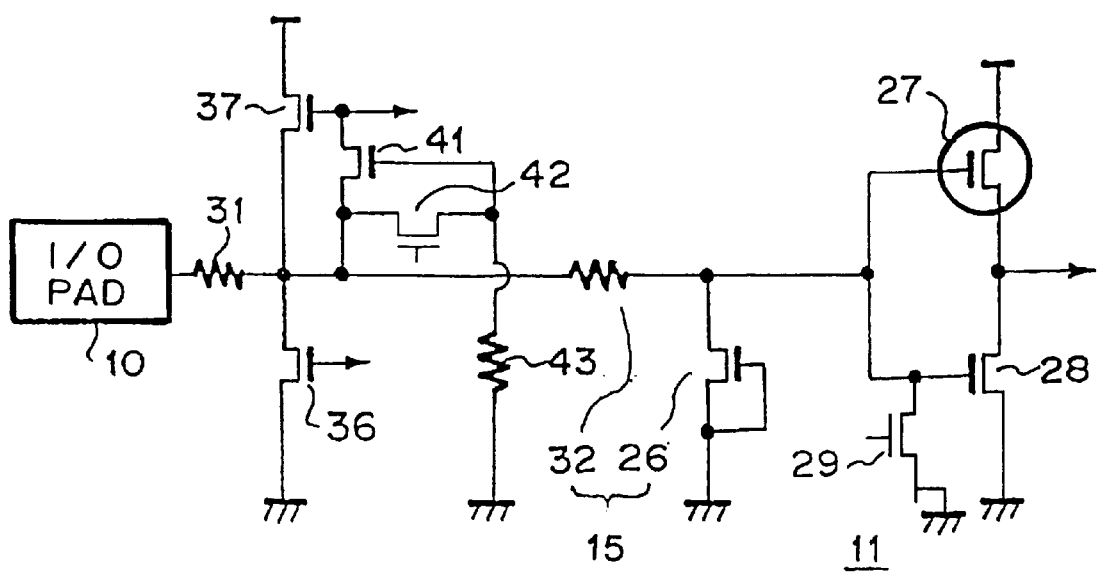
FIG. 2 is another circuit diagram of the semiconductor integrated circuit of the present invention.

Another embodiment of the present invention as shown in FIG. 2 comprises input and output (I/O) pad 10 corresponding to input pad 10, MOS transistor 26 and resistor 32 in the manner of diode connection corresponding to protection element 15, P channel MOS transistor 27 and N channel MOS transistor 28 in internal circuit 11, and bipolar transistor 29 connected with the gate and the source of N channel MOS transistor 28. Bipolar transistor 29 is adjacent to N channel MOS transistor 28.

I/O pad 10 is connected with NMOS transistor 36 and the source of load NMOS transistor 37. The gate of load NMOS transistor 37 is connected with the drain of NMOS transistor 41. Further, the source of NMOS transistor 41 is connected with the common connection point of NMOS transistor 36 and NMOS transistor 37. Further, the emitter and the collector of NPN transistor 42 are connected between the source and the gate of NMOS transistor 41. NPN transistor 42 is connected as a parasitic bipolar transistor. NPN transistor 42 functions like clamping element 20 as shown in FIG. 1. NMOS transistor 41 and NPN transistor 42 are connected with ground through third resistor 43. Thus, the circuit as shown in FIG. 2 includes protection functions like the circuit as shown in FIG. 1.

Although the present invention has been shown and described with respect to the best mode embodiment thereof, it should be understood by those skilled in the art that the foregoing and various other changes, omissions, and additions in the form and detail thereof may be made therein without departing from the spirit and scope of the present invention.

For example, a MOS or MIS transistor with a gate insulating film thicker than that of the other MOS or MIS transistors in the circuit element can be used as the clamping element in place of the parasitic bipolar transistor.

In the embodiment of FIG. 2, FET transistor 28, whose gate is connected with input pad 10, is arranged with a clamping element 29 connected between its gate and its source. As disclosed above, clamp 29 may be a bipolar transistor; alternatively, clamp 29 may be a FET transistor whose gate comprises an insulating film thicker than that of said FET transistor 28.

What is claimed is:

1. A semiconductor integrated circuit which comprises:

an input pad;

an internal circuit;

a transfer gate connected between said input pad and said internal circuit; and a clamping element which is connected with a gate of said transfer gate for protecting said transfer gate.

2. The semiconductor integrated circuit according to claim 1, wherein:

said transfer gate comprises a FET transistor, either the source or the drain of which is connected with said internal circuit; and said clamping element is connected between the gate of said FET transistor and either said source or said drain of said FET transistor.

3. The semiconductor integrated circuit of claim 2, wherein:

said FET transistor is a MIS transistor;

said source or the drain of said FET MIS transistor is coupled with said internal circuit via a resistor; and said transfer gate is coupled to said input pad via another resistor.

4. The semiconductor integrated circuit according to claim 3, wherein said gate of said FET transistor is connected with an internal voltage source or an external voltage source.

5. The semiconductor integrated circuit according to claim 2, wherein said clamping element is a parasitic bipolar transistor.

6. The semiconductor integrated circuit according to claim 3, wherein said clamping element is another FET transistor whose gate comprises an insulating film thicker than that of said FET transistor as said transfer gate.

7. The semiconductor integrated circuit according to claim 1, wherein:

the gate of said transfer gate is connected with either a source or a drain of said clamping element; and either said source or said drain of said clamping element is connected with either said source or drain of said transfer gate.

8. The semiconductor integrated circuit according to claim 1, wherein said clamping element is located adjacent to said transfer gate.

9. A semiconductor integrated circuit which comprises:

an input pad;

a MIS transistor whose gate is connected with power supply or ground voltage, wherein either source or drain of said MIS transistor is coupled with said input pad; and a clamping element which is connected between said gate and either of said source or said drain.

10. The semiconductor integrated circuit of claim 9, wherein:

said MIS transistor gate is coupled with power supply or ground voltage via a resistor; and said either source or drain of said MIS transistor is coupled with said input pad via another resistor.

11. The semiconductor integrated circuit according to claim 9, wherein said clamping element includes a parasitic bipolar transistor.

12. The semiconductor integrated circuit according to claim 9, wherein said clamping element includes another MIS transistor whose gate comprises an insulating film thicker than that of said MIS transistor.

13. A semiconductor integrated circuit which comprises:

an input pad;

a FET transistor whose gate is coupled with said input pad, wherein either of the source or the drain of said FET transistor is coupled with power supply or ground voltage; and a clamping element connected between said gate and either of said source or said drain, which clamping element includes a parasitic bipolar transistor adjacent to said FET transistor.

14. The semiconductor integrated circuit of claim 13, wherein said FET transistor gate is connected with said input pad through at least one resistor.

15. A semiconductor integrated circuit which comprises:

an input pad;

a FET transistor whose gate is coupled with said input pad, wherein either of the source or the drain of said MIS transistor is coupled with power supply or ground voltage; and a clamping element connected between said gate and either of said source or said drain, which includes another FET transistor whose gate comprises an insulating film thicker than that of said FET transistor.

16. The semiconductor integrated circuit of claim 15, wherein said FET transistor gate is connected with said input pad through at least one resistor.

* * * * *